(12) United States Patent
Chauhan

(10) Patent No.: US 7,839,178 B2
(45) Date of Patent: Nov. 23, 2010

(54) HIGH SPEED DIGITAL PHASE/FREQUENCY COMPARATOR FOR PHASE LOCKED LOOPS

(75) Inventor: Sundeep Chauhan, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 1104 days.

(21) Appl. No.: 10/625,386

(22) Filed: Jul. 23, 2003

(65) Prior Publication Data
US 2004/0070432 A1    Apr. 15, 2004

Related U.S. Application Data

(60) Provisional application No. 60/404,683, filed on Aug. 20, 2002.

(51) Int. Cl.
*H03D 13/00* (2006.01)
(52) U.S. Cl. .................... 327/12; 327/2; 327/7
(58) Field of Classification Search .................. 327/2, 327/3, 7, 9, 12, 17, 39, 40, 42, 43, 45, 47, 327/49, 147, 156, 159, 162; 331/11, 18, 331/25; 375/375, 376
See application file for complete search history.

(56) References Cited

U.S. PATENT DOCUMENTS

| | | | | |
|---|---|---|---|---|
| 5,121,070 A | * | 6/1992 | Tomita | 329/304 |
| 5,193,103 A | * | 3/1993 | Singh et al. | 375/376 |
| 5,313,503 A | | 5/1994 | Jones et al. | |
| 5,473,274 A | * | 12/1995 | Reilly et al. | 327/159 |
| 5,537,069 A | | 7/1996 | Volk | |
| 5,596,614 A | * | 1/1997 | Ledda | 375/376 |
| 5,648,994 A | * | 7/1997 | Kao | 375/376 |
| 5,671,258 A | | 9/1997 | Burns et al. | |
| 5,757,868 A | | 5/1998 | Kelton et al. | |
| 5,764,709 A | | 6/1998 | Whiteside | |
| 5,818,265 A | | 10/1998 | Meller et al. | |
| 5,883,536 A | | 3/1999 | Patterson | |
| 5,896,067 A | | 4/1999 | Williams | |
| 5,942,937 A | | 8/1999 | Bell | |
| 5,990,673 A | | 11/1999 | Forsberg | |
| 5,994,932 A | * | 11/1999 | Ando | 327/156 |
| 6,087,868 A | | 7/2000 | Millar | |
| 6,107,890 A | | 8/2000 | Carson et al. | |
| 6,351,154 B2 | * | 2/2002 | Brachmann et al. | 327/12 |
| 6,388,480 B1 | * | 5/2002 | Stubbs et al. | 327/156 |
| 6,404,248 B1 | * | 6/2002 | Yoneda | 327/158 |
| 6,414,526 B1 | * | 7/2002 | Guinea et al. | 327/153 |

(Continued)

*Primary Examiner*—Hai L Nguyen
(74) *Attorney, Agent, or Firm*—Fellers, Snider, et al.

(57) ABSTRACT

An apparatus and method for detecting a phase difference between an input signal and a reference signal in an all-digital phase locked loop (PLL) are provided. In a preferred embodiment, an N-stage tapped delay line and N-bit parallel latch are used to create a snapshot of the input signal by latching the output of the tapped delay line using the reference signal to clock the latch. An edge detector and encoder circuit translate the latched snapshot into a numerical phase difference value. A difference between this phase difference value and a desired phase difference is calculated and then added to an accumulator. The result in the accumulator is a numerical phase error value that can be fed to a numerically controlled oscillator (NCO). The output of the NCO can, in turn, be fed back into the phase/frequency comparator as the input signal, thus forming a fully-digital PLL.

19 Claims, 4 Drawing Sheets

U.S. PATENT DOCUMENTS

| | | | |
|---|---|---|---|
| 6,429,693 B1 * | 8/2002 | Staszewski et al. | 327/12 |
| 6,493,653 B1 | 12/2002 | Drinkard et al. | |
| 6,552,619 B2 | 4/2003 | Shastri | |
| 6,593,773 B2 * | 7/2003 | Staszewski et al. | 326/46 |
| 6,630,868 B2 * | 10/2003 | Perrott et al. | 331/17 |
| 6,819,157 B2 * | 11/2004 | Cao et al. | 327/262 |

* cited by examiner

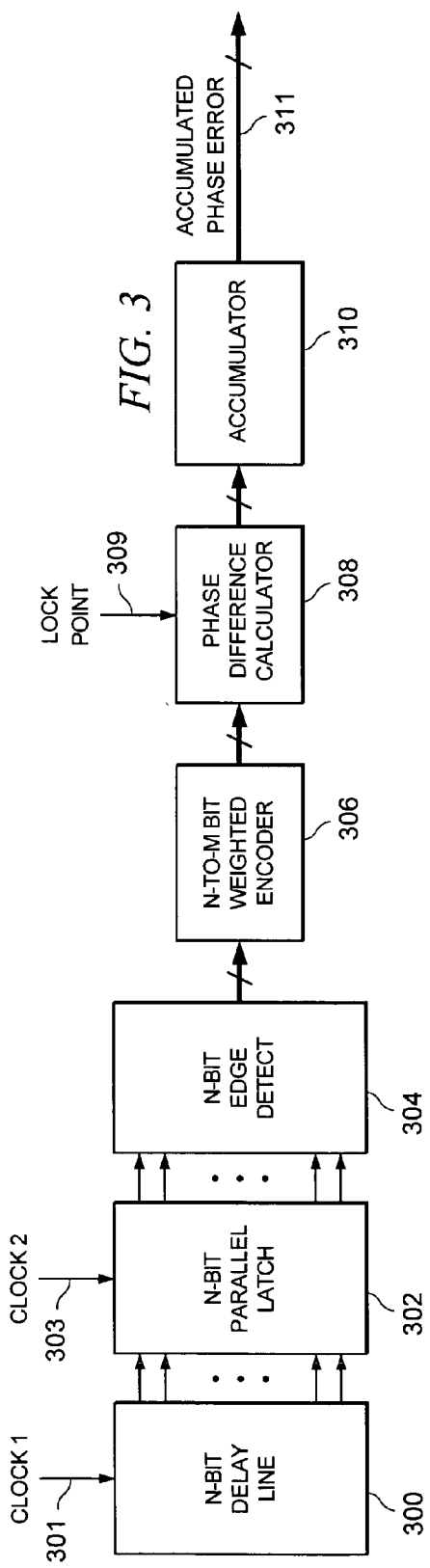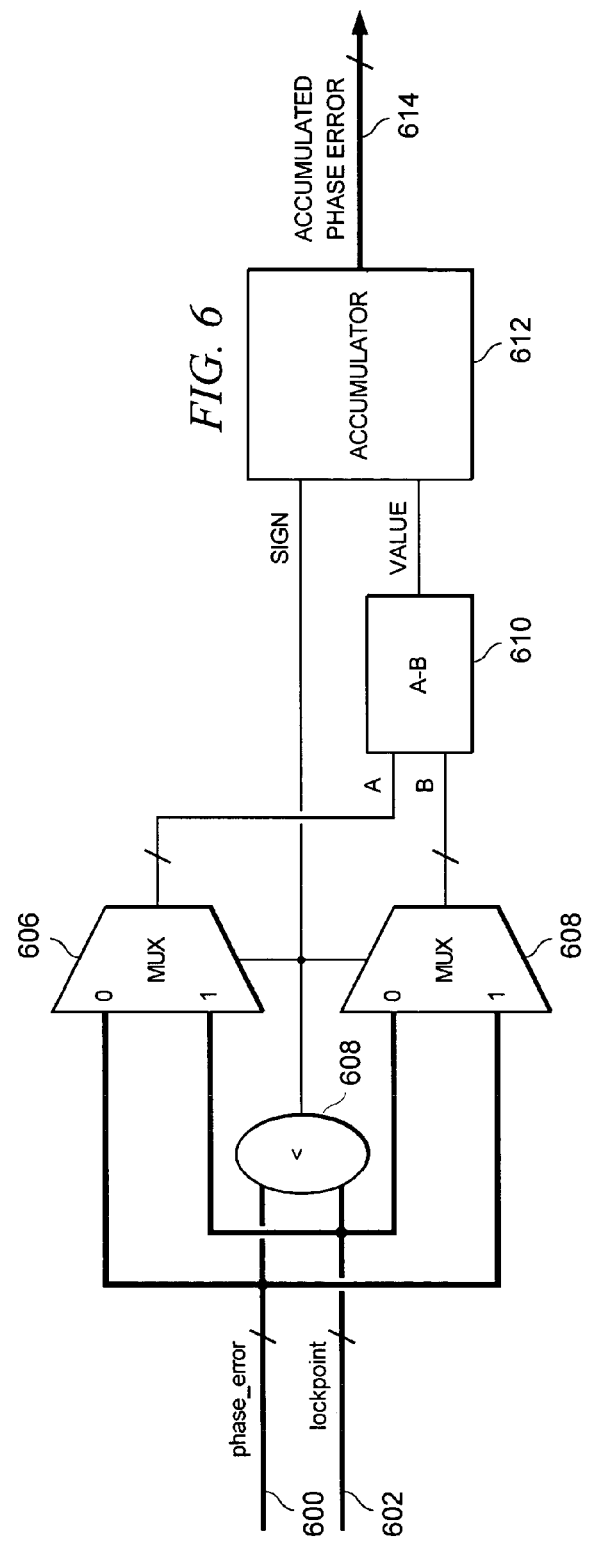

HIGH SPEED DIGITAL PHASE/FREQUENCY COMPARATOR FOR PHASE LOCKED LOOPS

CROSS REFERENCE TO RELATED APPLICATIONS

This application claims the benefit of the filing date of corresponding U.S. Provisional Patent Application No. 60/404,683, entitled "HIGH FREQUENCY ALL DIGITAL PHASE-FREQUENCY COMPARATOR," filed Aug. 20, 2002.

FIELD OF THE INVENTION

The present invention is generally related to components of digital phase locked loops. In particular, the present invention provides an apparatus and method for rapidly determining a phase difference between an output signal and a reference signal in an all-digital phase locked loop.

BACKGROUND OF THE INVENTION

Phase locked loops (PLLs) have a variety of applications in various fields. In hard disc drives, for example, PLLs are commonly used to extract clock information from the data signal and thus synchronize the data retrieval with internal functions of the read channel, to ensure that incoming data is retrieved and analyzed correctly. In order to perform this function, a PLL needs to be able to follow the phase as well as the frequency of the read signal. A key component of PLLs is the phase measure circuit, which is also referred to as a phase comparator or phase detector in the literature.

FIG. 1 is a block diagram of an analog phase-locked loop. The input to the phase locked loop is reference frequency 102, which is fed into phase detector 104. The other input to the phase detector will be discussed below. The output of phase detector 104 is fed into charge pump 106. (It should be noted that many, but not all PLLs include charge pumps; some simply couple the phase detector directly to the low-pass filter.) The charge pump creates a current for the period of time during which the phase error exists. This signal is filtered through low-pass filter 108 to obtain a voltage Vc, which is fed into voltage controlled oscillator (VCO) 114. Low-pass filter 108 is made up of a resistor 110 and capacitor 112 together in series, but placed in shunt with the output of charge pump 106. Various higher-order filters may be used, but low-pass filter 108, as depicted, provides the basic building block for higher order filters. The significance of low-pass filter 108's structure will be discussed shortly.

VCO 114's output (node 116) is the frequency output from the circuit and equals N*f(ref). This signal is fed into frequency divider 118 that divides f(clk) by N, which is an integer value in the range of 1, 2, . . . , N. The output of frequency divider 118 equals f(clk)/N at steady-state and this is the second input to phase detector 104. This completes the feedback loop. Since both inputs to phase detector 104 equal f(clk)/N, any shift in one of these frequencies will be detected by phase detector 104 and feed through charge pump 106 to voltage controlled oscillator 114. This results in f(clk) being adjusted to bring it back into sync to a value N*f(ref). This in sync condition is known as being "in lock," hence the name phase-locked loop.

At steady-state, as one skilled in the art will recognize, the voltage Vc will be a DC constant. For instance, when a PLL is used as a frequency synthesizer, Vc will largely stay constant. The low-pass filter of a PLL is therefore designed to block out spurious AC signals that may corrupt Vc.

In many cases, however, the reference voltage will vary over time. One commonly encountered situation where this occurs is when a PLL is used to demodulate frequency-modulated (FM) radio signals. In an FM radio signal, the frequency of the signal is constantly changing. Thus, there is a need to be able to rapidly re-obtain lock.

The structure of low-pass filter 108 addresses these dual concerns. Capacitor 112 drains away high-frequency signal components to ground, thus spurious AC signals are prevented from reaching VCO 114. Capacitor 112 by itself, however, makes for a rather unstable system, and particularly so because it is coupled to charge pump 106. Instantaneous changes in the reference frequency can result in ringing at a lone shunt capacitor. This translates into a slower lock, since the ringing must die down before a stable lock is established. Thus, resistor 110 is placed in series with capacitor 112 to provide a damping effect. This damping reduces the degree and length of ringing, so that lock may be more rapidly obtained.

In order to fully implement a PLL in an ASIC (application-specific integrated circuit) design using programmable circuit arrays such as FPGAs (field programmable gate arrays), a fully digital PLL design is needed, and analog circuit components such as phase/frequency detector 104 must be replaced with equivalent digital circuits. An example of an existing approach to the design of an all-digital phase/frequency detector can be found in U.S. Pat. No. 5,757,868 to Kelton et al. A schematic diagram of the Kelton et al. phase/frequency detector is provided in FIG. 2.

In the Kelton et al. phase/frequency detector, an input signal 208 is synchronized at D flip-flop 201 with a reference clock signal 200 provided by local oscillator 203. Reference clock signal 200 is at a frequency that is $2^N$ times a base reference frequency LO, where N is a constant. Output 209 of D flip-flop 201 is combined with a second reference clock signal 212 at exclusive-nor (XNOR) gate 202. Reference clock signal 212 is at the base reference frequency LO. XNOR gate 202 acts as a one-bit multiplier, and its resultant output 210 is provided to and gate 206, which performs a Boolean "and" operation on reference clock signal 200 and resultant 210. Output 213 of and gate 206 drives the clock input of N-bit counter 207, thus causing counter 207 to increment (or decrement, depending on the design) during periods of time in which reference clock signal 212 and input signal 208 have the same value. A third reference clock signal 214 at a frequency of 2LO is used to reset counter 207.

At the end of every cycle of reference clock signal 214, output 215 of counter 207 is a number that reflects the amount of phase error between input signal 208 and reference clock signal 212. Since reference clock signal 214 has a frequency of 2LO, if input signal 208 and reference clock signal 212 are perfectly in phase, counter 207 will have cycled through all $2^N$ of its possible output values two times, and, thus, output 215 will be zero. If input signal 208 and reference clock signal 212 are not perfectly in phase, however, counter 207 will not have gone through two complete cycles of $2^N$ output values, and output 215 will be a non-zero number. A sign detector 205 takes resultant 210, reference clock signal 214, and output 215 as inputs, and derives a signed numerical phase error 216.

For high frequency input signals, however, the Kelton et al. approach and similar counter-based designs can be somewhat impractical, however. That is because reference clock signal 200 (i.e., the clock signal that drives the counter) must be several orders of magnitude higher in frequency than the input signal, in order to have an acceptable level of accuracy.

For example, if the input signal frequency is 30 MHz, a counter clock frequency of 3 GHz is needed in order to achieve +/−1% accuracy. Depending on the nature of the PLL application, such an approach may be prohibitively expensive at the frequencies of interest.

Thus, there is a need for a high-speed phase/frequency comparator design for use in phase locked loops. The present invention provides a solution to this and other problems, and offers other advantages over previous solutions.

SUMMARY OF THE INVENTION

A preferred embodiment of the present invention provides an apparatus and method for detecting a phase difference between an input signal and a reference signal in an all-digital phase locked loop (PLL). An N-stage tapped delay line and N-bit parallel latch are used to create a snapshot of the waveform of the input signal by latching the output of the tapped delay line using the reference signal as the clock signal to the latch. An edge detector and encoder circuit translate the latched snapshot into a numerical phase difference value. A difference between this phase difference value and a desired phase difference is calculated, and this resulting difference is added to the value stored in an accumulator. The resulting value in the accumulator is a numerical phase error value that can be fed to a numerically controlled oscillator (NCO). The output of the NCO can, in turn, be fed back into the phase/frequency comparator as the input signal, thus forming a fully-digital PLL that can be incorporated into a digital application-specific integrated circuit (ASIC) design.

These and various other features and advantages that characterize the present invention will be apparent upon reading of the following detailed description and review of the associated drawings.

BRIEF DESCRIPTION OF THE DRAWINGS

FIG. 3 is a block diagram of a phase/frequency comparator design in accordance with a preferred embodiment of the present invention;

FIG. 6 is a schematic diagram of a phase difference calculator and accumulator in accordance with a preferred embodiment of the present invention.

DETAILED DESCRIPTION

Figure 1:
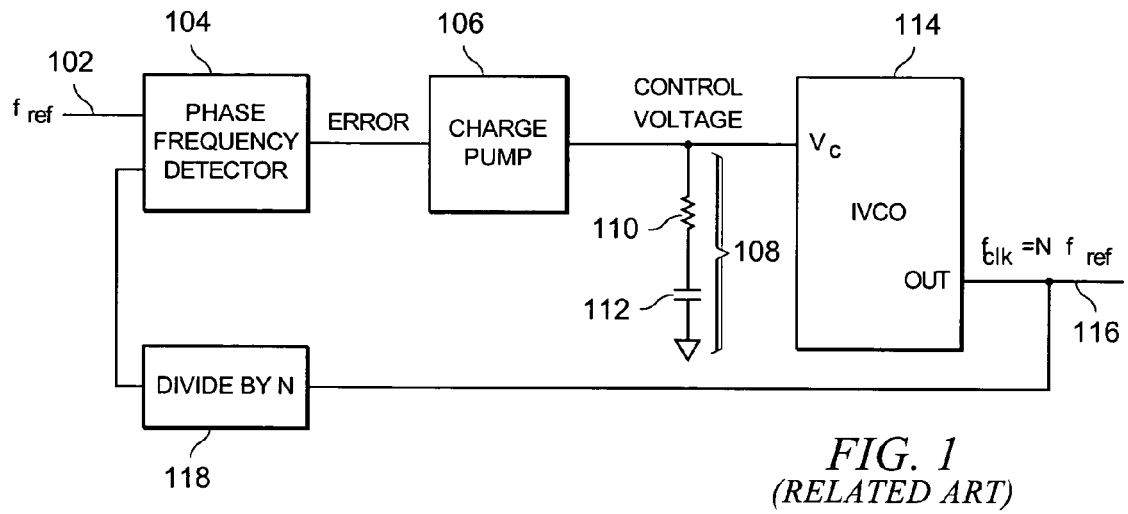
FIG. 1 is a block diagram of an analog phase locked loop (PLL)

FIG. 3 is a block diagram of a phase/frequency comparator design in accordance with a preferred embodiment of the present invention. Input clock signal 301 is fed to N-bit tapped delay line 300. N-bit tapped delay line 300 has N outputs, each of which duplicates input clock signal 301, but with incrementally increasing propagation delays. More specifically, if the outputs of N-bit tapped delay line 300 are numbered $Q_1, Q_2, \ldots Q_N$ and the propagation delay of input signal 301 to output $Q_1$ is equal to P, then the propagation delay to output $Q_2$ is equal to P+U, where U is some unit delay time. Similarly, the propagation delay to output Q3 would be P+2U, the propagation delay to output $Q_4$ would be P+3U, and so on. Thus, as a transition in input signal 301 propagates through delay line 300, the N taps or outputs of N-bit tapped delay line 300 reflect the propagation of this transition. For example, if N=5, and a transition from low to high (0 to 1) is made, delay line 300 will first output 00000, then 10000, then 11000, then 11100, then 11110, then finally 11111, at which the outputs of delay line 300 will remain until another transition in input signal 301 is made. One of ordinary skill in the art will recognize that N-bit tapped delay line may be implemented by connecting a number of non-inverting logic gates (e.g., buffers) in series and placing a tap between each two consecutive gates.

N-bit parallel latch 302 latches in the outputs of N-bit tapped delay line 300 when reference clock signal 303 transitions (either from low to high or high to low, depending on the latch design). The output of N-bit parallel latch 302 is thus a snapshot of the progress of input signal 301 through N-bit tapped delay line 300 over one cycle of reference clock signal 303. This snapshot is fed into N-bit edge detect circuit 304, which is described in more detail in FIG. 4. N-bit edge detect circuit 304 outputs a single bit at the transition point of a falling edge (or rising edge, depending on the design) in the snapshot provided by N-bit parallel latch 302. This signal bit may be referred to as a transition location signal.

Figure 7:
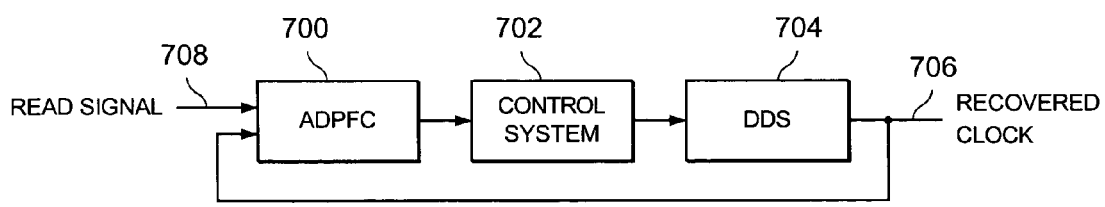
FIG. 7 is a block diagram of a PLL in accordance with a preferred embodiment of the present invention.

Weighted encoder 306 converts the output of N-bit edge-detect circuit 304 into a numerical phase difference value that reflects the phase difference between input signal 301 and reference signal 303. Phase difference calculator 308 calculates the difference between the output of weighted encoder 306 and a lock point input 309. Lock point input 309 is used to specify a particular desired phase difference between input signal 301 and reference signal 303. The output of phase difference calculator 308 is added to the value stored in an accumulator 310. Accumulator 310 serves as the digital counterpart to low-pass filter 108 in the analog PLL of FIG. 1, as an accumulator in digital signal processing acts like an integrator (which is a kind of low-pass filter) in analog signal processing. The resulting output 311 is a digital phase error signal that can be used to control a numerically controlled oscillator (NCO), as depicted in FIG. 7.

Figure 4:
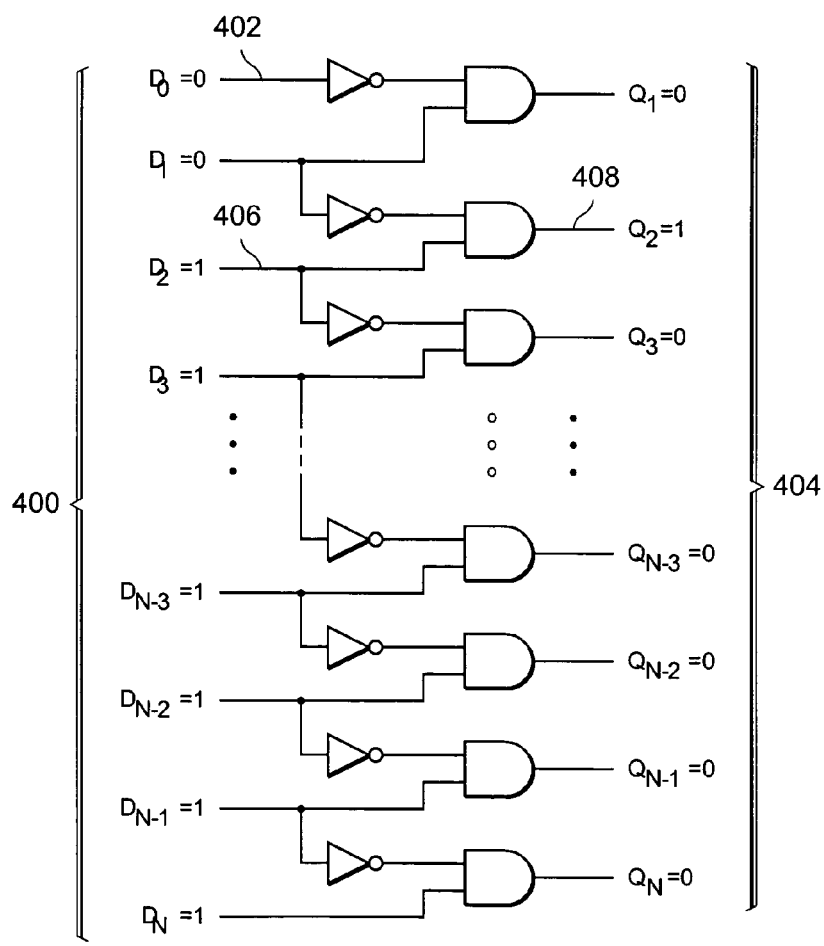
FIG. 4 is a schematic diagram of an edge detector in accordance with a preferred embodiment of the present invention.
Figure 2:
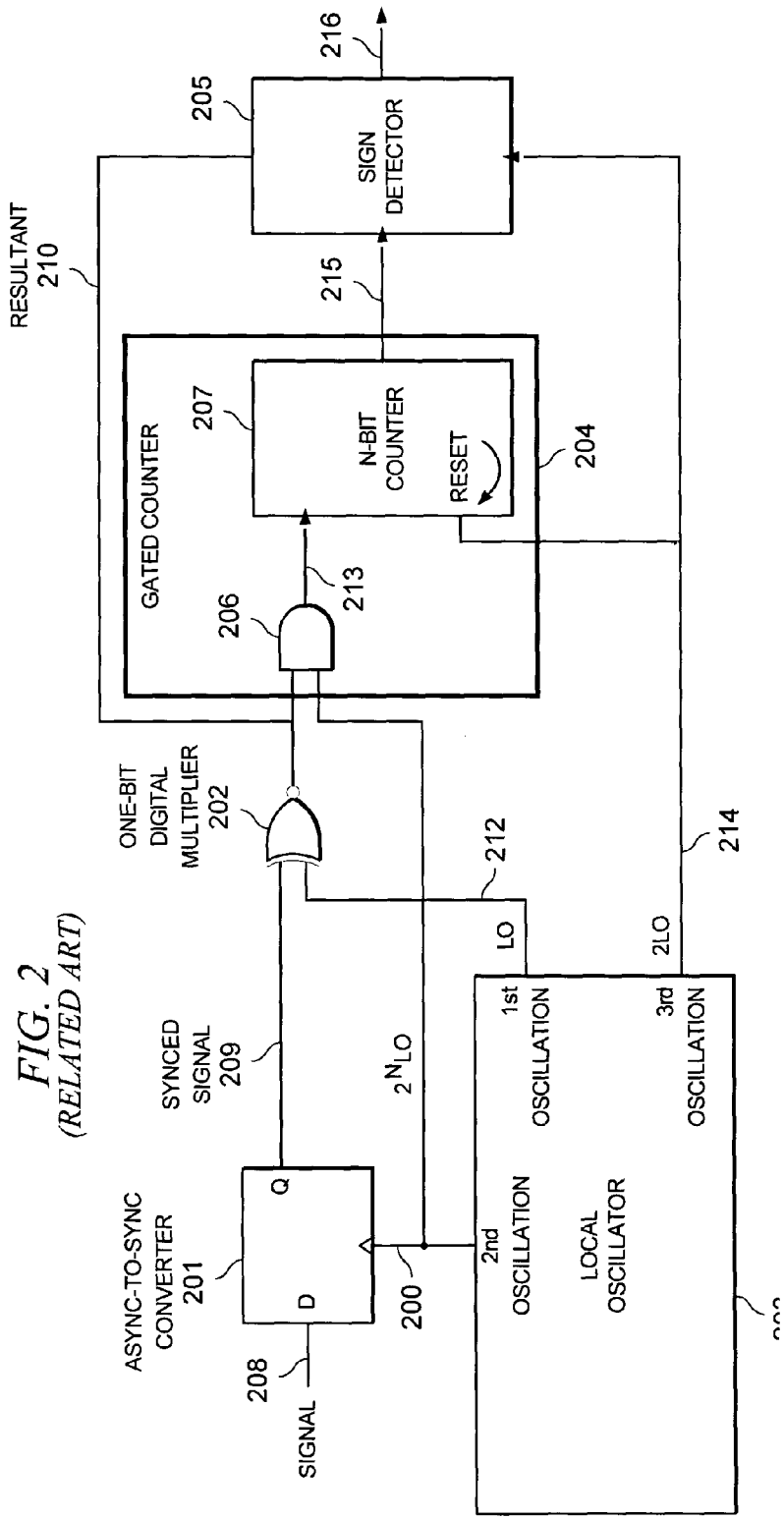
FIG. 2 is a schematic diagram of an all-digital phase/frequency comparator design.

FIG. 4 is a schematic diagram of an edge detector, such as edge detector 304, in accordance with a preferred embodiment of the present invention. Inputs 400 are a snapshot of input signal 301 as output by N-bit parallel latch 302. In FIG. 4, inputs 400 should be interpreted as reflecting a signal that propagates from top to bottom. In particular, inputs 400 reflect a snapshot of input signal 301 making a transition from a logic-low state (0) to a logic-high state (1).

There are N inputs 400 and N outputs 404. Each of outputs 404 is the Boolean conjunction ("and") of its corresponding input in inputs 400 with the Boolean complement ("not") of the preceding input in inputs 400. More specifically, if inputs 400 are numbered $D_1, D_2, \ldots, D_N$ from top to bottom, and outputs 404 are numbered $Q_1, Q_2, \ldots, Q_N$ from top to bottom, then $Q_2=D_2$ & $\sim D_1$, $Q_3=D_3$ & $\sim D_2$, and so forth. Input 402 (which may be thought of as "$D_0$") is permanently fixed at a logic-low (0) state and is used as the "preceding" input of the first input in inputs 400, so as to keep the propagation delays from inputs 400 to outputs 404 uniform.

The logic function computed by the edge detector depicted in FIG. 4 outputs at outputs 404 a single "1" at the point of a rising edge in the snapshot provided by inputs 400. In FIG. 4, in particular, outputs 404 are all at "0" (logic-low), except for a single bit at output 408, which is the output that corresponds to the location of the rising edge in inputs 400 (i.e., the output that corresponds to input 406). Outputs 404 are fed into N-to-M Bit weighted encoder 306 (FIG. 3), an exemplary implementation of which is depicted in FIG. 5.

Figure 5:
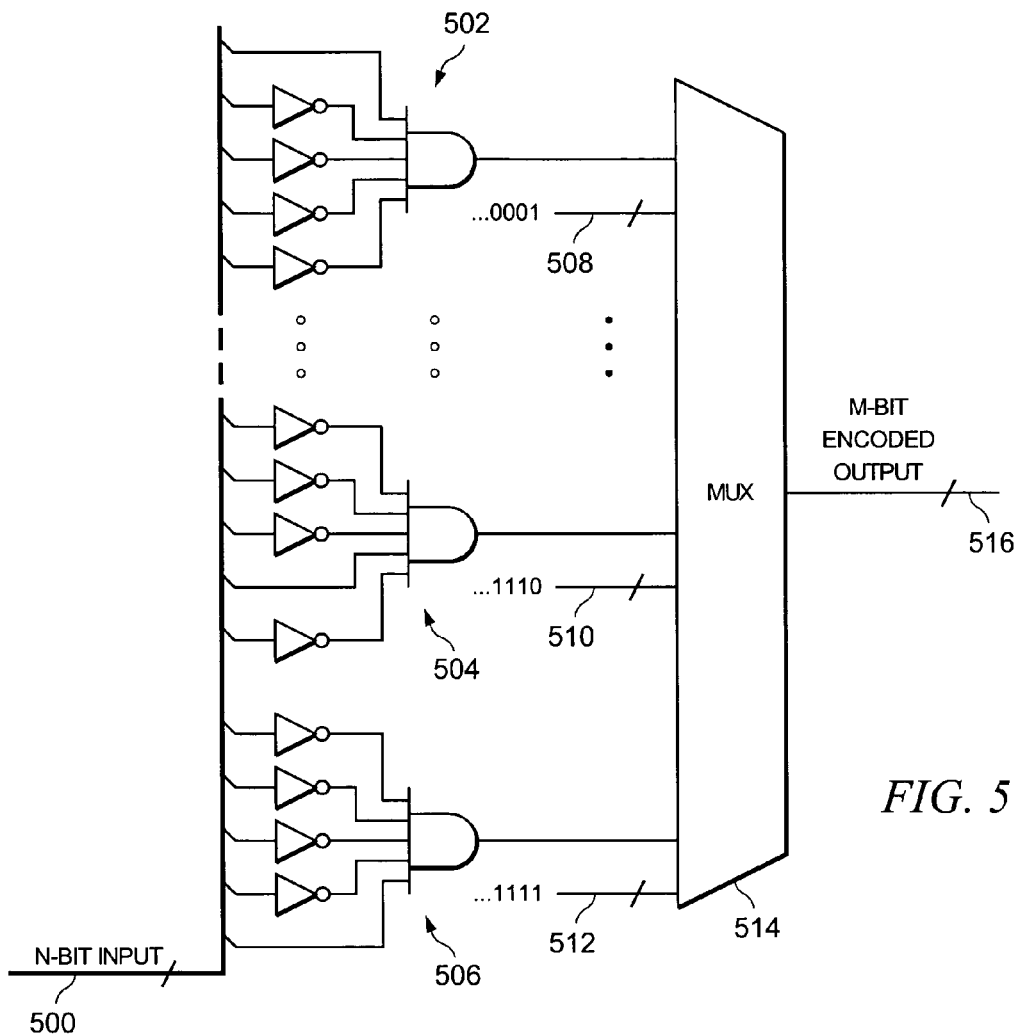
FIG. 5 is a schematic diagram of an N-to-M bit weighted encoder in accordance with a preferred embodiment of the present invention.

FIG. 5 is a schematic diagram of an N-to-M bit weighted encoder, such as N-to-M 306 in FIG. 3, in accordance with a preferred embodiment of the present invention. N-bit input 500 is provided by outputs 404 of N-bit edge detect circuit 304. A set of N decoder circuits (one for each of the N bits of input 500) is provided (e.g., decoder circuits 502, 504, and 506). Each of these decoder circuits detects a single position for a rising-edge transition bit in input 500 (as output by edge detect circuit 304). The outputs of each of these decoder circuits are fed into a multiplexor 514. Each decoder circuit output causes a different M-bit phase difference value to be output at M-bit encoded output 516. The particular M-bit phase difference values corresponding to each decoder circuit are provided as inputs to multiplexor 514. For example, if decoder circuit 502 outputs a "1" or logic-high, then a corresponding M-bit phase difference value 508 is presented at output 516. Likewise, if decoder circuit 504 outputs a "1" or logic-high, corresponding M-bit phase difference value 510 is presented at output 516. The preferred embodiment depicted here allows for different weighted values to be presented at the M-bit inputs (e.g., inputs 508, 510, and 512) for different transition points. Inputs 508, 510, and 512, for example, could be weighted so that output 516 presents a scaled or weighted phase difference to facilitate more rapid or more stable phase locking in a PLL, depending on the circuit designer's preferences.

FIG. 6 is a schematic diagram of a phase difference calculator (e.g., phase difference calculator 308 in FIG. 3) and accumulator (e.g., accumulator 310 in FIG. 3) in accordance with a preferred embodiment of the present invention. Phase error input 600 is the M-bit output of N-to-M weighted encoder 306 (FIG. 3). Lockpoint input 602 (corresponding to lockpoint input 309 in FIG. 3) is a numerical representation of a desired is phase difference between the input and reference signals. A comparator 604 and multiplexors 606 and 608 are configured so as to present the values at phase error input 600 and lockpoint input 602 as an ordered pair (A, B) to subtractor 610, with A being the larger of the two inputs, so that subtractor 610 computes the absolute value of the difference between phase error input 600 and lockpoint input 602. Comparator 604, by comparing phase error input 600 and lockpoint input 602, derives a sign bit, which is fed into accumulator 612 along with the difference computed by subtractor 610. An accumulator is a digital electronic component that internally stores a value that is a running total of the inputs provided to the accumulator over time. In FIG. 6, if the sign bit computed by comparator 604 is negative, the value stored in accumulator 612 is reduced by the difference computed by subtractor 610. Likewise, if the sign bit is positive, the value stored in accumulator 612 is increased by the difference computed by subtractor 610. The value stored in accumulator 612, the accumulated phase error, is the output of the phase/frequency comparator, and is provided as output at output 614.

FIG. 7 is a block diagram of a fully digital PLL in accordance with a preferred embodiment of the present invention. An all-digital phase/frequency comparator (ADPFC) 700, such as the preferred embodiment depicted in FIG. 3, generates a numerical phase difference value. Additional digital control or digital signal processing circuitry 702 may be used to normalize the phase difference value derived by ADPFC 700 to generate a frequency correction value that is an appropriate input to direct digital synthesis (DDS) circuit 704. A DDS circuit, also known as a numerically-controlled oscillator (NCO), is an oscillator circuit that generates an output clock signal that is proportional to the value stored in its frequency register. DDS/NCO circuits are well known in the art. One of ordinary skill in the art will recognize that many DDS circuits are readily available and can be easily integrated onto the same integrated circuit as the PLL itself. Output 706 of DDS circuit 704 is connected in a feedback loop as the input signal to ADPFC 700. Input 708 is presented as the reference signal to ADPFC 700. The complete circuit is a fully digital high-speed PLL in which output 706 tracks input 708.

The fully digital PLL depicted in FIG. 7 has many applications, as one of ordinary skill in the art will recognize. A digital PLL made in accordance with a preferred embodiment of the present invention may be used to phase-lock output 706 to a timing servo signal read from a disc drive presented as input 708, for example. Moreover, a preferred embodiment of the present invention is of particular benefit whenever phase/frequency comparisons of high-frequency signals are required.

Thus, a preferred embodiment of the present invention provides an apparatus and method for detecting a phase difference between an input signal and a reference signal in an all-digital phase locked loop (PLL), which can be incorporated into a digital application-specific integrated circuit (ASIC) design, such as a disc drive controller chip, or a programmable integrated circuit, such as a field-programmable gate array (FPGA). Specifically, a novel apparatus and method for controlling the arrival of a disc drive arm assembly at a track, are herein disclosed and characterized by steps of propagating a first signal through a tapped delay line; latching outputs of the tapped delay line in a parallel latch in response to a transition in a second signal to obtain a snapshot of the first signal at a point in time; mapping the snapshot to a numerical phase difference value; combining the numerical phase difference value with a value in an accumulator to obtain a new accumulator value; and presenting the new accumulator value as a result of a phase comparison.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A phase/frequency comparator comprising:
   a phase detecting stage comprising:
      a tapped delay line having a plurality of outputs and configured to receive a first signal; and
      a parallel latch configured to store values of the plurality of outputs of the tapped delay line in response to a transition in a second signal; and
   encoding circuitry comprising:
      an edge detector that outputs a transition location signal that indicates a location of a transition in the values stored in the parallel latch; and
      a weighted encoder that outputs a weighted numerical value that corresponds to the transition location signal; and
   an accumulator that adds the weighted numerical value to a value stored in the accumulator to obtain an accumulated phase error.

2. The phase/frequency comparator of claim 1, wherein the encoding circuitry includes a phase difference calculator configured to receive a lockpoint input, calculate a signed difference between the weighted numerical value and the lockpoint input; and present the signed difference to the accumulator as a numerical phase difference value.

3. The phase/frequency comparator of claim 1, wherein the weighted numerical value is presented to the accumulator as the numerical phase difference value.

4. A phase locked loop comprising:
a controllable oscillator; and
a phase/frequency comparator coupled to the controllable oscillator such that an output of the controllable oscillator is connected in a feedback loop to an input of the phase/frequency comparator and an output of the phase/frequency comparator is connected through a forward path to a control input of the controlled oscillator,
wherein the phase/frequency comparator includes:
a phase detecting stage;
encoding circuitry coupled to the phase detecting stage; and
an accumulator coupled to the encoding circuitry.

5. The phase locked loop of claim 4, wherein the forward path includes additional control circuitry.

6. The phase locked loop of claim 4, wherein the controlled oscillator is a numerically controlled oscillator.

7. The phase locked loop of claim 4, wherein the phase locked loop is implemented as a single monolithic integrated circuit.

8. The phase locked loop of claim 4, wherein the phase locked loop is implemented as a field-programmable gate array.

9. The phase locked loop of claim 4, wherein the phase detecting stage further comprises:
a tapped delay line having a plurality of outputs and configured to receive a first signal; and
a parallel latch coupled to the plurality of outputs of the tapped delay line and configured to receive a second signal,
wherein the parallel latch stores the values of the plurality of outputs of the tapped delay line in response to a transition in the second signal; and
wherein the encoding circuitry converts the values stored in the parallel latch into a numerical phase difference value.

10. The phase locked loop of claim 9, further comprising:
an accumulator coupled to the encoding circuitry,
wherein the accumulator adds the numerical phase difference value to a value stored in the accumulator to obtain an accumulated phase error.

11. The phase locked loop of claim 10, wherein the encoding circuitry includes:

an edge detector coupled to the parallel latch; and
a weighted encoder,
wherein the edge detector outputs a transition location signal that indicates a location of a transition in the values stored in the parallel latch; and
wherein the weighted encoder outputs a weighted numerical value that corresponds to the transition location signal.

12. The phase locked loop of claim 11, wherein the encoding circuitry includes:
a phase difference calculator configured to receive a lockpoint input,
wherein the phase difference calculator calculates a signed difference between the weighted numerical value and the lockpoint input; and
wherein the signed difference is presented to the accumulator as the numerical phase difference value.

13. The phase locked loop of claim 11, wherein the weighted numerical value is presented to the accumulator as the numerical phase difference value.

14. A method comprising:
generating a snapshot of a first signal in response to receiving a second signal;
detecting a location of an edge in the snapshot of the first signal; and
mapping the location into a weighted numerical value that indicates a numerical phase difference value that is generated responsive to a signal that corresponds to a transition location of the first signal.

15. The method of claim 14, further comprising:
comparing the weighted numerical value with a desired phase difference; and
presenting a difference between the weighted numerical value and the desired phase difference as the numerical phase difference value.

16. The method of claim 14, further comprising:
combining the numerical phase difference value with a value in an accumulator to obtain a new accumulator value; and
presenting the new accumulator value as a result of a phase comparison.

17. The method of claim 16, further comprising:
propagating the first signal through a tapped delay line;
latching outputs of the tapped delay line in a parallel latch in response to a transition in the second signal to obtain the snapshot of the first signal.

18. The method of claim 14, further comprising:
controlling an output frequency of an oscillator using the result of the phase comparison.

19. The method of claim 18, wherein one of the first signal and the second signal is an output of the oscillator.

* * * * *